United States Patent [19]
Ohtani

[11] Patent Number: 5,973,378
[45] Date of Patent: *Oct. 26, 1999

[54] SEMICONDUCTOR DEVICE WITH INSULATED GATE ELECTRODE CONFIGURED FOR REDUCING ELECTRIC FIELD ADJACENT DRAIN

[75] Inventor: Hisashi Ohtani, Kanagawa, Japan

[73] Assignee: Semiconductor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/976,739

[22] Filed: Nov. 24, 1997

[30] Foreign Application Priority Data

Nov. 29, 1996  [JP]  Japan ................................. 8-334641

[51] Int. Cl.$^6$ ................................................. H01L 29/41
[52] U.S. Cl. ........................ 257/401; 257/900; 257/761; 257/327
[58] Field of Search ............................... 257/401, 57, 59, 257/900, 761, 335, 327, 339, 280, 281; 438/260, 265, 182

[56] References Cited

U.S. PATENT DOCUMENTS

| | | | |
|---|---|---|---|
| 5,177,577 | 1/1993 | Taniguchi et al. . | |
| 5,272,100 | 12/1993 | Satoh et al. ............................. | 438/305 |
| 5,308,998 | 5/1994 | Yamazaki et al. ....................... | 257/72 |
| 5,422,505 | 6/1995 | Shirai ..................................... | 257/401 |
| 5,430,320 | 7/1995 | Lee ......................................... | 257/412 |
| 5,481,121 | 1/1996 | Zhang et al. ............................ | 257/72 |
| 5,518,805 | 5/1996 | Ho et al. . | |
| 5,518,936 | 5/1996 | Yamamoto et al. . | |
| 5,580,800 | 12/1996 | Zhang et al. ............................ | 437/40 |
| 5,604,137 | 2/1997 | Yamazaki et al. ....................... | 437/40 |
| 5,612,234 | 3/1997 | Ha ........................................... | 437/40 |
| 5,619,045 | 4/1997 | Konuma et al. ......................... | 257/72 |
| 5,643,817 | 7/1997 | Kim et al. ............................... | 437/51 |
| 5,668,032 | 9/1997 | Holmberg et al. ...................... | 257/59 |
| 5,670,795 | 9/1997 | Ikeda ...................................... | 257/72 |
| 5,731,216 | 3/1998 | Holmberg et al. ...................... | 437/40 |
| 5,741,736 | 4/1998 | Orlowski et al. ....................... | 438/286 |
| 5,742,363 | 4/1998 | Bae ......................................... | 249/48 |

FOREIGN PATENT DOCUMENTS

406275641  8/1994  Japan .......................... H01L 21/336

*Primary Examiner*—Jerome Jackson, Jr.
*Assistant Examiner*—Bradley William Baumeister
*Attorney, Agent, or Firm*—Fish & Richardson P.C.

[57] ABSTRACT

An insulated-gate field effect transistor with the structure capable of weakening an electric field near or around the drain thereof. To this end, the transistor of the top gate type has its gate electrode which is formed of two kinds of metal layers (4, 5) capable of being anodized while carefully selecting materials and anodization process conditions in such a way as to let anodization of the lowermost metal layer (4) be faster in progress than that of its overlying metal layer (5). This ensures that an intensity-decreased electric field is applied to a portion (20) underlying an anodized part of the lower metal layer not only through a gate insulation film (3) but also through an anodized oxide (17). A weak inversion layer as created by this electric field may cause the electric field to decrease in intensity near or around the drain.

17 Claims, 3 Drawing Sheets

SEMICONDUCTOR DEVICE WITH INSULATED GATE ELECTRODE CONFIGURED FOR REDUCING ELECTRIC FIELD ADJACENT DRAIN

BACKGROUND OF THE INVENTION

1. Field of the Invention

The invention as disclosed relates to a device and manufacturing method for semiconductor devices and specifically devices having an insulated gate electrode.

2. Description of the Prior Art

As microfabrication causes insulated-gate field effect transistors to decrease in size, a potential difference near the drain rapidly increases. This could result in electrons or holes ("hot carriers") that have been accelerated by such potential difference to exhibit bad behavior. This in turn leads to several problems. This problem becomes more serious especially for the so-called "submicron" devices with channel lengths less than or equal to one micrometer ($\mu$m).

In those transistors (thin-film transistors, for example) employing certain semiconductor materials with grain boundaries such as polycrystalline semiconductor, the potential-difference increase might also increase leakage current upon application of a reverse bias voltage to the gate electrode (in the turned-off state). To avoid this, it should be required that the near-the-drain potential difference be decreased or "moderated". Several types of insulated-gate field effect transistors of different structures have been proposed for this purpose.

Figure 3A:
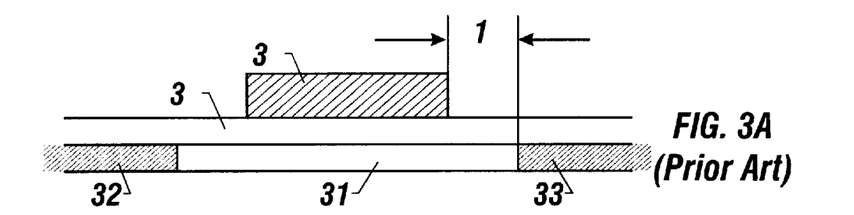
FIGS. 3A–3D show in cross-section some prior known transistor structures including the off-set structure and LDD structure.

One typical transistor structure shown in FIG. 3A is generally known as the offset gate type which is structured in a manner such that it has a source 32 and drain 33 with an intrinsic (or of the opposite conductivity type to that of the source/drain) semiconductor layer (active layer) 31 being laid between them. This system also has a gate electrode 35 overlying an active layer 31 with a gate insulation film 34 being sandwiched therebetween them. The gate electrode 35 is laterally spaced apart from the drain 33 by a predefined distance $x_1$. An electric field as created near the drain is weakened or moderated enabling elimination of hot carriers' contribution.

Figure 3B:
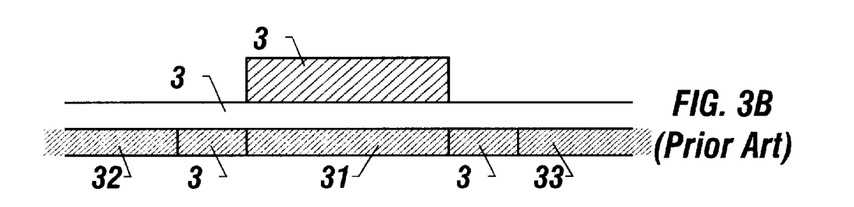

Another prior known transistor structure is shown in FIG. 3B. This is called the lightly-doped drain (LDD) structure and is disclosed in Examined Published Japanese Patent Application No. 3-38755. An impurity concentration-reduced region (lightly doped impurity region) 37 is provided between the drain 33 and active layer 31. This region is the same in conductivity type as drain 33. A similar lightly doped impurity region 36 may also be provided between the source 32 and active layer 31. With such an arrangement, the lightly doped region 37 acts as a buffer region which may weaken the electric field near the drain.

Figure 3C:
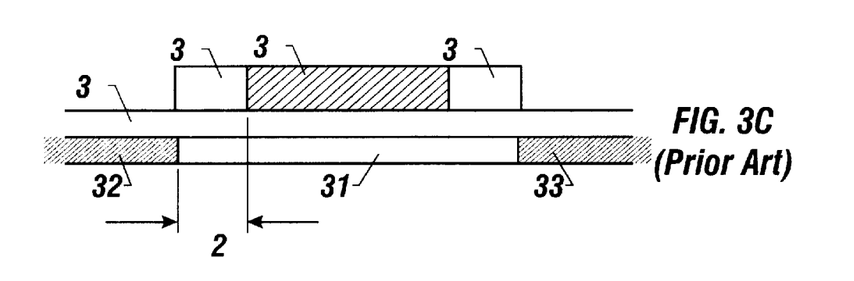

The offset gate structure may be successfully fabricated by anode-oxidization or "anodization" of the gate electrode as described in Unexamined Published Japanese Patent Application Nos. 6-338612, 7-226515. As shown in FIG. 3C, the gate electrode is located spaced from the source/drain by a selected distance corresponding to the thickness $x_2$ of an anodized oxide 38. This effectively performs a self-alignment doping process using the anodized oxide 38, by letting the gate electrode be anodized at its side wall for formation of the source 32 and drain 33.

Figure 3D:
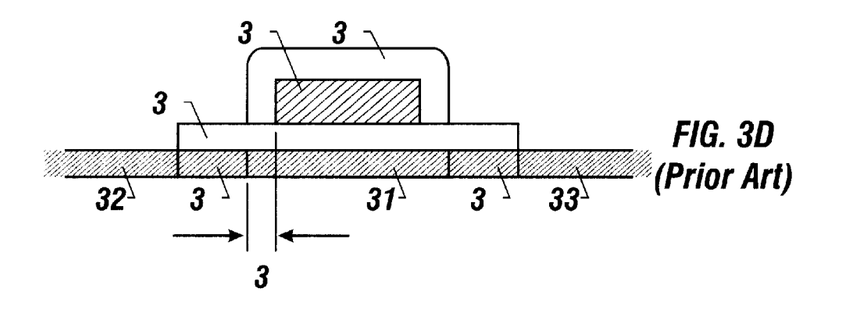

Similarly, the lightly doped impurity region may also be fabricated successfully by anodizing the gate electrode as taught from Unexamined Published Japanese Patent Application No. 7-169974. While a detailed explanation is omitted herein, this approach makes it possible to define intended lightly doped regions 36, 37 which are approximately equal in width to the resultant anodized oxide as formed by anodization of the side wall of the gate electrode. Further, Unexamined Published Japanese Patent Application No. 7-169974 discloses therein a transistor structure, wherein the gate electrode 35 is far from the lightly doped regions 36, 37 by a specific distance equivalent to the thickness $x_3$ of an anodized oxide 39 covering the gate electrode 35 in a strict sense, as shown in FIG. 3D.

Figure 4:
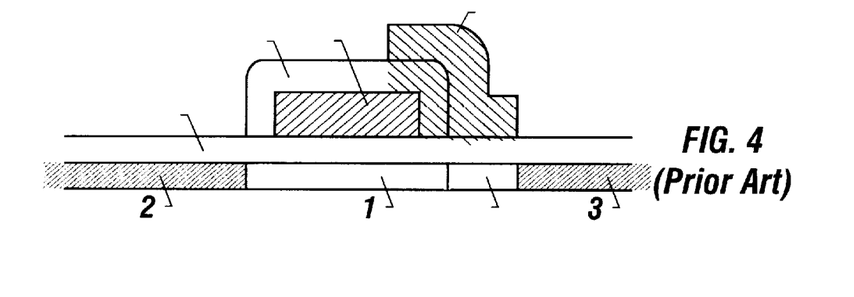
FIG. 4 shows a cross-sectional view of a further prior art field effect transistor structure of the offset gate type.

While the offset gate structure is a simple and easy-to-fabricate structure, it unfortunately remains less effective at electric field reduction. In contrast, the LDD structure has a significant electric-field reduction effect, but suffers from the necessity of performing additional doping processes. A structure has been proposed as one approach to avoiding these problems, which permits formation of an intended region capable of exhibiting similar functions as those of the lightly-doped drain. This structure applies an electric field thereto as shown in FIG. 4 rather than by doping impurities thereinto. The offset structure of the field effect type as suggested by Examined Published Japanese Patent Application No. 8-17238.

As apparent from viewing FIG. 4, this field-effect offset gate transistor has a source 42, drain 43, active layer 41, gate insulation film 44 and gate electrode 45. The gate electrode 45 is spaced apart from drain 43, thereby providing the offset gate structure and wherein a second gate electrode 40 is provided overlying this part with a dielectric layer 49 being sandwiched therebetween. The dielectric layer 49 may be made of a chosen dielectric material obtainable by anodization of gate electrode 45.

In this structure, the drain is of N type conductivity. A positive bias voltage is applied to the second gate electrode 40 forming a weak inversion layer at a part 47 underlying the second gate electrode 40. Since this is similar in function to drains of lightly doped or "weak" N type conductivity, the region 47 exhibits similar effects to lightly-doped drains. If the source and drain are of P type conductivity, then the voltage applied to the second gate electrode is potentially reversed into the negative polarity.

While the structure discussed above requires no additional doping processes for formation of the lightly-doped impurity region, this does not come without accompanying a penalty: it does require additional formation of the second gate electrode 40, which in turn increases complexity of the fabrication process thereby making it impossible to offer advantages over the prior art LDD transistor structures.

SUMMARY OF THE INVENTION

It is therefore an object of the present invention to provide an improved insulated-gate transistor structure capable of avoiding the problems faced by the prior art.

It is another object of the invention to provide an insulated-gate field effect transistor capable of offering similar effects to currently available off-set gate transistors while at the same time reducing or minimizing structural complexity.

To attain the foregoing objects, the invention provides an insulated gate field effect transistor, wherein a gate electrode includes at least two kinds of metal layers of different conductive materials laminated. The lowermost metal layer of the gate electrode is less in width than its overlying metal layer. The gate electrode is covered by an anodization oxide on at least the side surface thereof. At least one of the source and drain is formed in self-alignment with the gate electrode and its associative anodization oxide layer.

In accordance with one aspect of the invention, the lowermost metal layer comprises tantalum whereas its overlying metal layer comprises aluminum as major constituents thereof, respectively. Preferably, the distance between the metal layer overlying the lowermost metal layer and the drain is from 500 to 1000 angstroms (Å).

These and other objects, features and advantages of the invention will be apparent from the following more particular description of preferred embodiments of the invention, as illustrated in the accompanying drawings.

DETAILED DESCRIPTION OF THE INVENTION

The invention as will be disclosed herein is such that an insulated-gate field effect transistor of the top gate type has its gate electrode having a lamination of two kinds of anodizable metal layers. Metal layer materials and anodization process criteria as well as other parameters concerned can ensure that the lowermost metal layer (in contact with a gate insulation film) has a greater anodization rate than its next or overlying metal layer during anodization of the gate electrode formed from the multi-laminated metal layers.

Figure 2A:
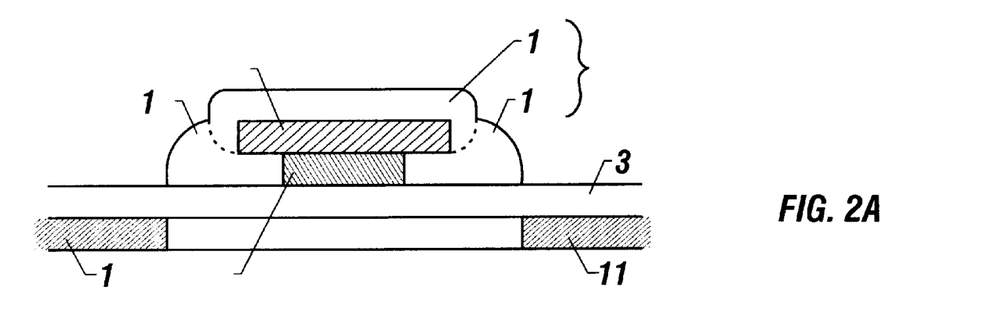
FIGS. 2A to 2D illustrate in schematic cross-section some of the major steps in the process of the invention.

The resulting structure near the gate electrode of the transistor thus fabricated by the above anodization process is as shown in FIG. 2A. In this example the gate electrode has two metal layers, i.e. a lower metal layer 4 and upper metal layer 5. The lower metal layer 4 is narrower in line width than upper metal layer 5 since the anodization rate of lower layer 4 is greater than that of upper layer 5. An anodization oxide 8 is formed on side surfaces or "walls" of the gate electrode, which may be considered as an anodized oxide 17 of metal layer 4 and anodization oxide 18 of metal layer 5.

The anodization oxide is also formed on the upper or top surface of the gate electrode. However, the anodic oxide film on the top surface of the gate electrode may be replaced by a suitable insulating film such as silicon nitride.

By performing, in a self-alignment way, the impurity doping process with the gate electrode and its associated anodization oxide being as a mask therefor, a source 10 and drain 11 may be formed in an active layer 2. Very importantly, at least the drain is defined so that it is self-aligned with the gate electrode and its anodization oxide that are employed as the mask, as shown in FIG. 2A.

Figure 2B:
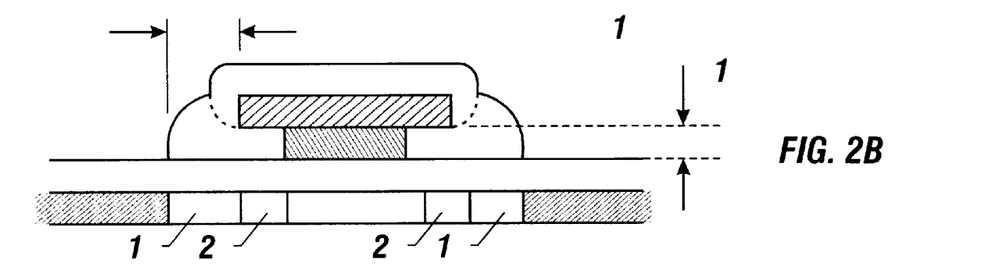

An operation of the transistor with this structure will be briefly explained below. First consider that the distance $x_0$ between the metal layer 5 and drain 11 (source 10) is sufficiently greater than the thickness $t_1$ of metal layer 4. A nondoped region of the active layer 2 may generally be subdivided into three parts: a region immediately beneath the metal layer 4 (channel region), its neighboring region 20 underlying metal layer 5, and a midway region 19 as located between the region 20 and source 10 (drain 11) as shown in FIG. 2B.

Any affection or influence of the gate electrode (metal layer 5) upon the region 19 may be negligible since the distance $x_0$ is sufficiently larger than thickness $t_1$. This results in the region 19 functioning in a way similar to that of an off-set gate region. On the other hand, the region 20 is affected by the gate electrode (metal layer 5) through an anodized oxide 17 of the metal layer 4. The significance of the effect may be inversely proportional to the thickness of anodization oxide 17 but remains proportional to the dielectric constant of such anodization oxide. By way of example, where the metal layer 4 is made of tantalum deposited to a thickness of 5000 angstroms (Å), the relative dielectric constant of a tantalum oxide that is the anodized oxide thereof is 22. The thickness of anodization oxide may alternatively be 5000 Å, which may be equivalent due to largeness of its dielectric constant to 900 Å or more or less through calculational conversion to silicon oxide (relative dielectric constant is 3.9).

If the gate insulation film 3 is made of silicon oxide approximately 900 Å thick then the net thickness of gate insulation film in the region 20 is equivalent to 2000 Å after calculational conversion, more specifically, the gate electrode's affection in the region 20 is almost half that of the channel region (the region immediately beneath metal layer 4). Accordingly, a weak inversion layer takes place in region 20 providing similar functions to those of the region 47 of FIG. 4.

Figure 2C:
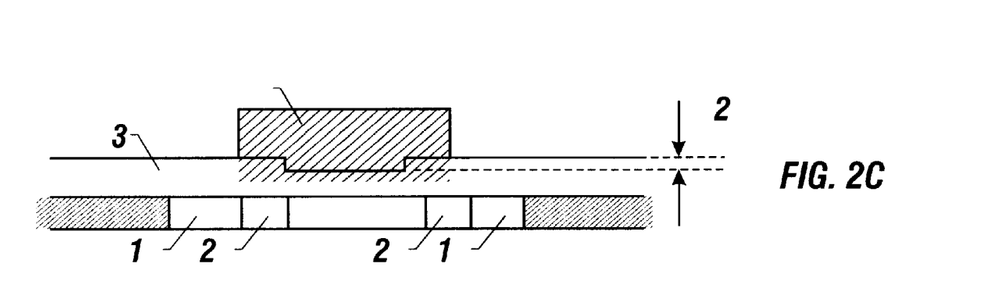

This may be explained referring to FIG. 2C, as follows. That is, the thickness of the gate insulating film 3 on the region 20 is greater by a thickness $t_2$ than the thickness of the gate insulating film on the channel region as can be seen from FIG. 2C. Here, the thickness $t_2$ may be given as:

$$t_2 = t_1 \epsilon_{G1}/\epsilon_{AO},$$

where $\epsilon_{G1}$ is the dielectric constant of gate insulation film 3, and $\epsilon_{AO}$ is dielectric constant of anodization oxide 17.

Next consider about the case where the thickness $t_1$ of metal layer 4 is equal to or less than the distance $x_0$ between the metal layer 5 and the drain 11 (source 10). In this case, from a geometric viewpoint, affection of the gate electrode (metal layer 5) is not negligible even at part corresponding to the region 19 of FIG. 2B; practically, any region corresponding to the region 19 does not exist. In other words, all the nondoped regions other than the channel region are dedicated to creation of region 20, that is, the region permitting occurrence of a weak inversion layer therein.

In this way, it becomes possible to provide a structure having similar functions to those of the structure of FIG. 4. In the present invention less number of process steps may form the fabrication, due to capability of forming all the required gate electrodes at one time, unlike the prior art of FIG. 4.

Preferably, the distance $x_0$ may be between 500 to 1000 Å. The thickness $t_2$ may be 0.2 to 2 times greater than the thickness of the gate insulation film 3. Consequently, $t_1$ may be determinable using the above-presented formula in view of the dielectric constants of gate insulation film 3 and anodization oxide 17.

The material forming the metal layer 4 or 5 may be molybdenum, tantalum, aluminum, chromium, nickel, zirconium, titanium, palladium, silver, copper, cobalt, and others.

Turning now to FIGS. 1A–1E, an insulated-gate field effect thin-film transistor in accordance with one preferred embodiment is shown in cross-section at some of major steps of formation.

Figure 1A:
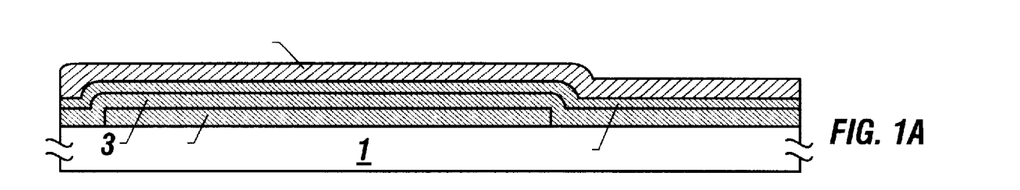
FIGS. 1A through 1E are diagrams illustrating, in schematic cross-section, some of major steps in the fabrication of an insulated-gate field effect transistor in accordance with one embodiment of the present invention.

As shown in FIG. 1A, an active layer 2 made of an intrinsic semiconductive coat film is formed on an insulative or dielectric substrate 1 using a chosen semiconductive material such as silicon or the like. For instance, the active layer 2 may be a polycrystalline silicon or "polysilicon," approximately 500 Å thick. Amorphous silicon may alternatively be employable. A gate insulation film 3 is formed overlying the active layer 2. The gate insulation film 3 may be a chosen dielectric film of silicon oxide, silicon nitride or equivalents thereto as formed by means of plasma chemical vapor deposition (CVD), low pressure CVD, atmosphere CVD, thermal oxidation or equivalent techniques thereof. Employed here is a silicon nitride film deposited by plasma CVD techniques to a predetermined thickness of 1000 Å. A tantalum film 4 measuring 2000 Å in thickness and an aluminum film 5 3000 Å thick are then deposited thereover by sputtering techniques as shown in FIG. 1A.

Figure 1B:
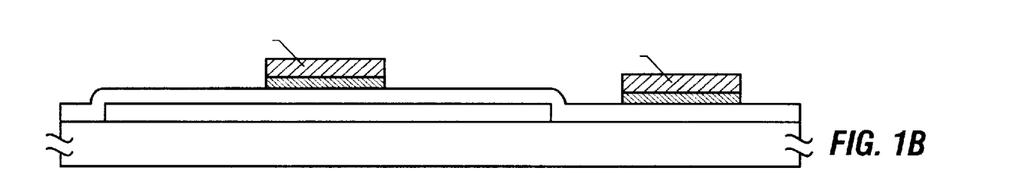

Then, as shown in FIG. 1B, a patterning process for formation of the gate electrode 6 and gate lead 7 is performed by known photolithography techniques in a way such that etching is done by known etching means, dry etching methods or wet etching methods, for example, forming gate electrode 6 and its associative gate lead 7.

Next, the gate electrode 6 and gate lead 7 are subjected to an anodization process. Three-weight percent aqueous ammonium tartrate solution may be used as the electrolytic solution for anodization. An application voltage is caused to gradually increase in potential. The anodization oxide formed likewise increases in thickness in a way such that the thickness of resultant anodization oxide is approximately proportional to the potential of such voltage applied thereto.

The resistivity of tantalum anodization oxide is one third, or more or less, of the resistivity of aluminum anodization oxide; accordingly, the tantalum anodization oxide is three times greater in thickness than the aluminum anodization oxide even upon application of the same voltage thereto.

Figure 1C:
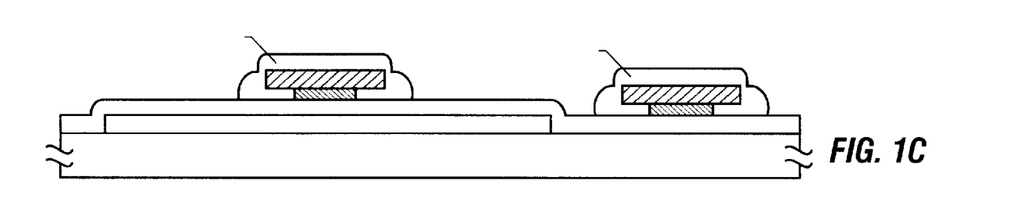
Figure 2D:
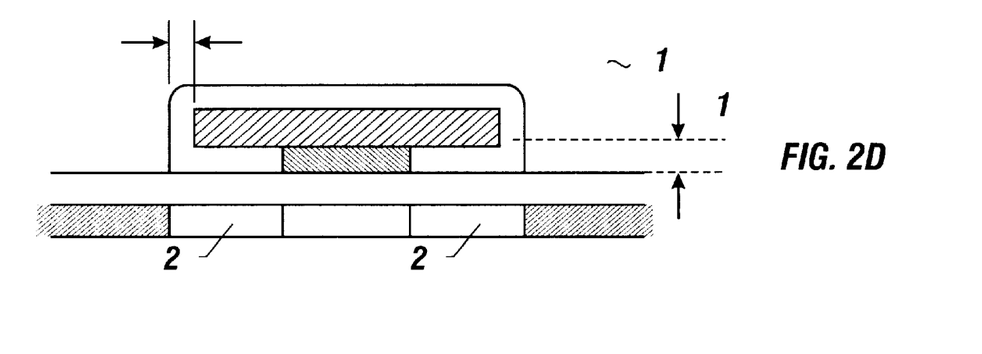

While the anodization process is performed in the way stated supra, the anodization was completed at an instant when the thickness $x_0$ of FIG. 2B or 2D becomes equal to 1000 Å. This results in anodization oxide layers 8, 9 on the gate electrode 6 and its associated gate lead 7 at the side walls and top surface thereof as illustrated in FIG. 1C.

Figure 1D:
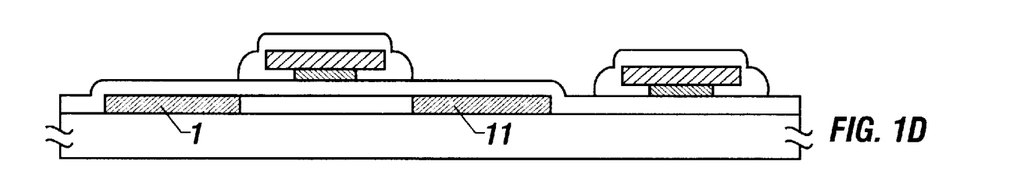

Next, as shown in FIG. 1D, a chosen impurity such as phosphorus, arsenic or boron is doped into the active layer 2 by known ion doping techniques, thereby forming a source 10 and drain 11.

Figure 1E:
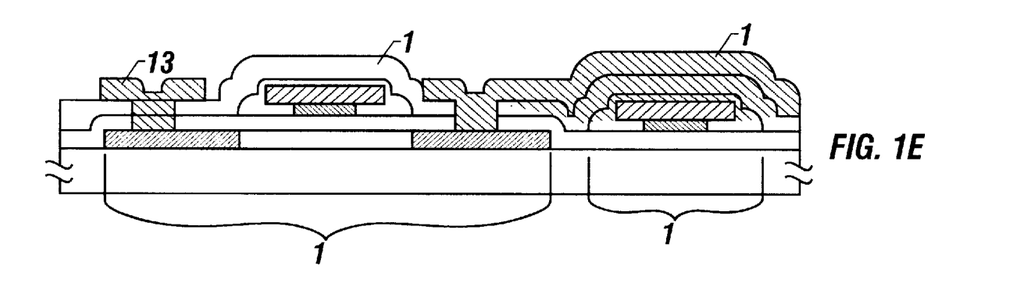

Further, an interlayer dielectric film 12 is formed by known techniques. By way of example, a silicon oxide film is deposited by plasma CVD techniques to a predetermined thickness of 5000 Å. Contact holes are also defined therein. Furthermore, a source lead 13 and drain lead 14 are formed by known metal lead patterning techniques. An aluminum film which is 5000 Å in thickness can be used to form the leads. When this is done, the sharpness of a stair-step like portion at part of the gate lead 7 is decreased or smoothed in shape due to the formation of such oxide at a specific portion 16 whereat the drain lead 14 transversely extends over drain lead 14, thereby minimizing the possibility of open-circuit. Thus, a thin-film transistor (TFT) 15 is finally fabricated as shown in FIG. 1E.

In the illustrative embodiment $x_0$=1000 Å whereas $t_1$=3000 Å ensuring that this may be equivalent to the currently available transistor structure shown in FIG. 2D. Additionally, $t_2$=531 Å.

One significant advantage of the present invention lies in capability of readily forming or fabricating intended field-effect transistors with functions similar to those of the LDD structure. It can thus be said that the instant invention offers enhanced industrial applicability.

Although the invention has been disclosed and illustrated with reference to particular embodiments, the principles involved are susceptible for use in numerous other embodiments, modification and alterations which will be apparent to persons skilled in the art to which the invention pertains. For example, while a top-gate type thin film transistor has been disclosed in the preferred embodiment, the present invention can be applied to a bottom gate type transistor in which a gate electrode is located below the channel forming region. Also, while an anodic oxidation method is preferred for simplicity, other methods such as photolithography may be used to form the gate electrode of the present invention. Further, the present invention can be used in a transistor formed within a single crystalline silicon wafer.

What is claimed is:

1. An insulated gate field effect transistor comprising:
   a semiconductor layer having, source, drain and channel regions therein;
   a gate insulating film adjacent to said semiconductor layer;
   a gate electrode adjacent to said channel region with said gate insulating film interposed therebetween,
   wherein said gate electrode includes at least a first conductive film in contact with said gate insulating film, and a second conductive film adjacent to said gate insulating film with said first conductive film interposed therebetween, and said second conductive film extends beyond side edges of said first conductive film, and said channel region extends beyond side edges of said second conductive film by a distance $x_0$; and
   wherein the first conductive film is thinner than the second conductive film.

2. An insulated gate field effect transistor according to claim 1 wherein a thickness of said first conductive film is smaller than said distance $x_0$.

3. An insulated gate field effect transistor according to claim 1 wherein a thickness of said first conductive film is greater than said distance $x_0$.

4. An insulated gate field effect transistor according to claim 1 wherein said gate electrode is located above said channel region.

5. An insulated gate field effect transistor according to claim 1 wherein said gate electrode is located below said channel region.

6. An insulated gate field effect transistor according to claim 1 wherein said first conductive film comprises a first oxidizable material and said second conductive film comprises a second oxidizable material which is more oxidizable than said first oxidizable material.

7. A semiconductor device comprising:
   a semiconductor layer having at least a channel region formed on an insulating surface;
   a gate insulating film formed on said semiconductor layer; and
   a gate electrode formed over said channel region with said gate insulating film interposed between said gate electrode and said channel region, said gate electrode comprising a first layer and a second layer formed on said first layer,
   wherein said first layer comprises tantalum and said second layer comprises aluminum; and wherein said first layer is thinner than said second layer.

8. A semiconductor device according to claim 7 wherein said gate insulating film comprises silicon oxide.

9. A semiconductor device according to claim 7 wherein said semiconductor layer comprises polycrystal silicon.

10. A semiconductor device according to claim 7 wherein said channel region extends beyond side edges of said gate electrode.

11. A semiconductor device comprising:
a semiconductor layer having at least a channel region formed on an insulating surface;
a gate insulating film formed on said semiconductor layer;
a gate electrode formed over said channel region with said gate insulating film interposed therebetween, said gate electrode comprising a first layer and a second layer formed on said first layer;
an insulating film formed on at least side surfaces of said gate electrode, said oxide film comprises an oxide of a material of said gate electrode;
wherein said first layer comprises tantalum and said second layer comprises aluminum; and
wherein said first layer is thinner than said second layer.

12. A semiconductor device according to claim 11 wherein said gate insulating film comprises silicon oxide.

13. A semiconductor device according to claim 11 wherein said semiconductor layer comprises polycrystalline silicon.

14. A semiconductor device according to claim 11 wherein said channel region extends beyond side edges of said gate electrode.

15. A semiconductor device comprising:
a semiconductor layer having at least a channel region therein;
a gate insulating film formed on said channel region;
a gate electrode formed on said gate insulating film, wherein said gate electrode includes at least a first conductive film comprising tantalum in contact with said gate insulating film, and a second conductive film comprising aluminum formed on said first conductive film, and said second conductive film extends beyond side edges of said first conductive film; and
said first conductive film being thinner than said second conductive film.

16. A semiconductor device according to claim 15 wherein said channel region extends beyond side edges of said second conductive film.

17. A semiconductor device according to claim 15 wherein said gate insulating film comprises silicon oxide.

* * * * *

UNITED STATES PATENT AND TRADEMARK OFFICE
CERTIFICATE OF CORRECTION

| | | |
|---|---|---|
| PATENT NO. | : 5,973,378 | |
| APPLICATION NO. | : 08/976739 | |
| DATED | : October 26, 1999 | |
| INVENTOR(S) | : Hisashi Ohtani | |

It is certified that error appears in the above-identified patent and that said Letters Patent is hereby corrected as shown below:

On the Title page, please replace the figure with "Figure 1E" attached hereto.

Sheet 1 of 3 of the figures, delete "FIG. 1A" (first occurrence).

Sheet 1 of 3 of the figures, please replace FIGS. 1A (Second Occurrence)-1E with the attached FIGS. 1A-1E.

Sheet 2 of 3 of the figures, please replace FIGS. 2A-2D with the attached FIGS. 2A-2D.

Sheet 3 of 3 of the figures, please replace FIGS. 3A-3D and FIG. 4 with the attached FIGS. 3A-3D and FIG. 4.

Signed and Sealed this

Third Day of June, 2008

JON W. DUDAS
*Director of the United States Patent and Trademark Office*

United States Patent [19]

Ohtani

[11] Patent Number: 5,973,378
[45] Date of Patent: *Oct. 26, 1999

[54] SEMICONDUCTOR DEVICE WITH INSULATED GATE ELECTRODE CONFIGURED FOR REDUCING ELECTRIC FIELD ADJACENT DRAIN

[75] Inventor: Hisashi Ohtani, Kanagawa, Japan

[73] Assignee: Semiconductor Energy Laboratory Co., Ltd., Kanagawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/976,739

[22] Filed: Nov. 24, 1997

[30] Foreign Application Priority Data

Nov. 29, 1996 [JP] Japan ............................. 8-334641

[51] Int. Cl.⁶ ..................................... H01L 29/41
[52] U.S. Cl. ..................... 257/401; 257/900; 257/761; 257/327
[58] Field of Search .................. 257/401, 57, 59, 257/900, 761, 335, 327, 339, 280, 281; 438/260, 265, 182

[56] References Cited

U.S. PATENT DOCUMENTS

| | | | |
|---|---|---|---|
| 5,177,577 | 1/1993 | Taniguchi et al. | |
| 5,272,100 | 12/1993 | Satoh et al. | 438/305 |
| 5,308,998 | 5/1994 | Yamazaki et al. | 257/72 |
| 5,422,505 | 6/1995 | Shirai | 257/401 |
| 5,430,320 | 7/1995 | Lee | 257/412 |
| 5,481,121 | 1/1996 | Zhang et al. | 257/72 |
| 5,518,805 | 5/1996 | Ho et al. | |
| 5,518,936 | 5/1996 | Yamamoto et al. | |
| 5,580,800 | 12/1996 | Zhang et al. | 437/40 |
| 5,604,137 | 2/1997 | Yamazaki et al. | 437/40 |
| 5,612,234 | 3/1997 | Ha | 437/40 |
| 5,619,045 | 4/1997 | Konuma et al. | 257/72 |
| 5,643,817 | 7/1997 | Kim et al. | 437/51 |
| 5,668,032 | 9/1997 | Holmberg et al. | 257/59 |
| 5,670,795 | 9/1997 | Ikeda | 257/72 |
| 5,731,216 | 3/1998 | Holmberg et al. | 437/40 |
| 5,741,736 | 4/1998 | Orlowski et al. | 438/286 |
| 5,742,363 | 4/1998 | Bae | 249/48 |

FOREIGN PATENT DOCUMENTS

406275641 8/1994 Japan ..................... H01L 21/336

*Primary Examiner*—Jerome Jackson, Jr.
*Assistant Examiner*—Bradley William Baumeister
*Attorney, Agent, or Firm*—Fish & Richardson P.C.

[57] ABSTRACT

An insulated-gate field effect transistor with the structure capable of weakening an electric field near or around the drain thereof. To this end, the transistor of the top gate type has its gate electrode which is formed of two kinds of metal layers (4, 5) capable of being anodized while carefully selecting materials and anodization process conditions in such a way as to let anodization of the lowermost metal layer (4) be faster in progress than that of its overlying metal layer (5). This ensures that an intensity-decreased electric field is applied to a portion (20) underlying an anodized part of the lower metal layer not only through a gate insulation film (3) but also through an anodized oxide (17). A weak inversion layer as created by this electric field may cause the electric field to decrease in intensity near or around the drain.

17 Claims, 3 Drawing Sheets